(12) United States Patent
Shu et al.

(10) Patent No.: US 10,566,195 B2
(45) Date of Patent: Feb. 18, 2020

(54) MULTIPLE PATTERNING WITH VARIABLE SPACE MANDREL CUTS

(71) Applicant: GLOBALFOUNDRIES Inc., Grand Cayman (KY)

(72) Inventors: Jiehui Shu, Clifton Park, NY (US); Jinping Liu, Ballston Lake, NY (US); Rui Chen, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 62 days.

(21) Appl. No.: 15/689,668

(22) Filed: Aug. 29, 2017

(65) Prior Publication Data

US 2019/0067010 A1 Feb. 28, 2019

(51) Int. Cl.
| | |
|---|---|
| *H01L 21/033* | (2006.01) |
| *H01L 21/311* | (2006.01) |
| *H01L 21/3105* | (2006.01) |
| *H01L 21/768* | (2006.01) |

(52) U.S. Cl.
CPC ...... *H01L 21/0338* (2013.01); *H01L 21/0332* (2013.01); *H01L 21/0337* (2013.01); *H01L 21/31051* (2013.01); *H01L 21/31111* (2013.01); *H01L 21/31144* (2013.01); *H01L 21/76816* (2013.01)

(58) Field of Classification Search
None
See application file for complete search history.

(56) References Cited

U.S. PATENT DOCUMENTS

| | | | |
|---|---|---|---|
| 9,177,797 B2 | 11/2015 | Chang et al. | |
| 2013/0340233 A1 | 12/2013 | Tollner et al. | |
| 2015/0014772 A1* | 1/2015 | Cheng | H01L 21/3086 257/347 |
| 2015/0111362 A1* | 4/2015 | Shieh | H01L 21/823431 438/424 |
| 2017/0316939 A1* | 11/2017 | deVilliers | H01L 21/0332 |

OTHER PUBLICATIONS

Shu, et al., "Variable Space Mandrel Cut for Shelf Aligned Double Patterning", U.S. Appl. No. 15/430,039, filed Feb. 10, 2017.

* cited by examiner

*Primary Examiner* — Anthony Ho
*Assistant Examiner* — Kevin Quinto
(74) *Attorney, Agent, or Firm* — Thompson Hine LLP; Anthony Canale

(57) ABSTRACT

Methods of multiple patterning. First and second mandrel lines are formed on a patternable layer. Sidewall spacers are formed on the patternable layer adjacent to the first mandrel line and adjacent to the second mandrel line. A portion of the first mandrel line is removed to form a gap in the first mandrel line. A gapfill material is deposited in the gap in the first mandrel line. The gapfill material and sidewall spacers are composed of the same material.

20 Claims, 13 Drawing Sheets

MULTIPLE PATTERNING WITH VARIABLE SPACE MANDREL CUTS

BACKGROUND

The present invention relates to semiconductor device fabrication and integrated circuits and, more specifically, to methods of multiple patterning.

As integrated circuit structures continue to shrink, device fabrication techniques are modified and adapted to make devices with increasingly smaller dimensions and increasingly smaller separations (i.e., pitch) between device features. Multiple patterning techniques, such as multiple pattern lithography, are often used to achieve spacing between device features, such as half-pitch spacing or even less, that could not be achieved by other lithography techniques. Such techniques generally include forming mandrel lines at pitch, sometimes referred to as "assist" lines or "dummy" lines, around which are formed sidewall spacers that are then used to pattern the actual desired features at half-pitch or lower into a patternable layer. In many cases, circuit structure designs require cuts or gaps in a single mandrel line or in multiple mandrel lines, in which each cut separates a single mandrel line into two or more mandrel lines.

SUMMARY

In an embodiment of the invention, a method includes forming first and second mandrel lines on a patternable layer, and forming sidewall spacers on the patternable layer adjacent to the first mandrel line and adjacent to the second mandrel line. The method further includes removing a portion of the first mandrel line to form a gap in the first mandrel line, and depositing a gapfill material in the gap in the first mandrel line. The gapfill material and sidewall spacers are composed of the same material.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 1A is a top view of the structure depicted in FIG. 1 in which FIG. 1 is taken generally along line 1-1.

DETAILED DESCRIPTION

Figure 1:
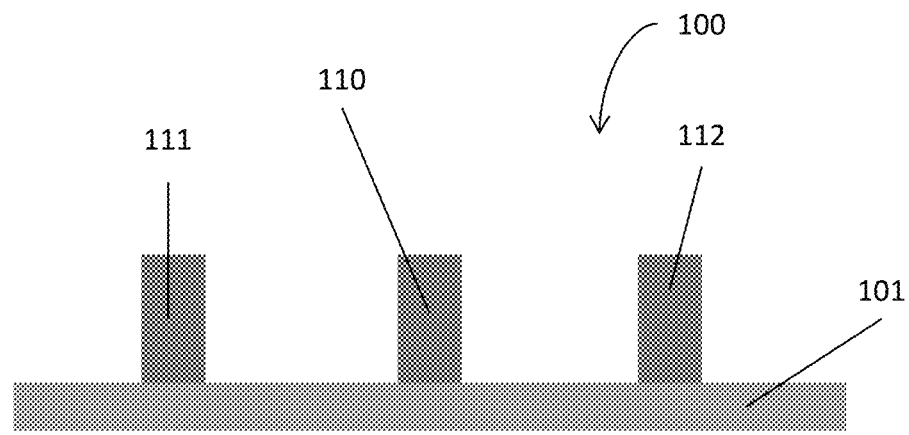
FIGS. 1-4 are cross-sectional views of a structure at successive fabrication stages of a processing method in accordance with embodiments of the invention.
Figure 1A:
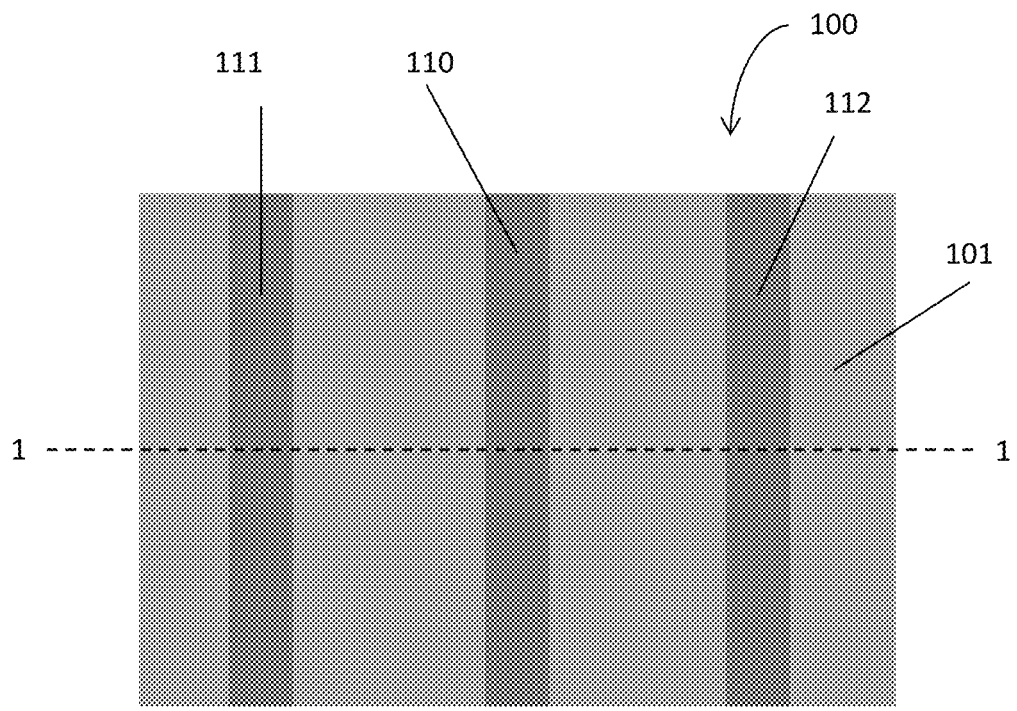

With reference to FIGS. 1 and 1A and in accordance with embodiments of the invention, a structure 100 is depicted following formation of a patternable layer 101 and mandrel lines 110, 111, and 112 over the patternable layer 101. Patternable layer 101 may be any layer of an integrated circuit structure in which features are to be patterned, such as a hardmask layer (e.g., a metal hardmask layer composed of, for example, titanium nitride (TiN)) on a dielectric layer (e.g., a low-k dielectric layer). Mandrel lines 110, 111, 112 may be formed, for example, by depositing a layer of sacrificial material and selectively removing or etching portions of the sacrificial material layer to leave mandrel lines 110, 111, 112. Mandrel lines 110, 111, 112, and the etchable material layer constituting the mandrel lines 110, 111, 112 may be formed from amorphous silicon, a polymer material, a polysilicon-based material, or other material that may be patterned and selectively removed relative to subsequently-formed spacers. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 2:
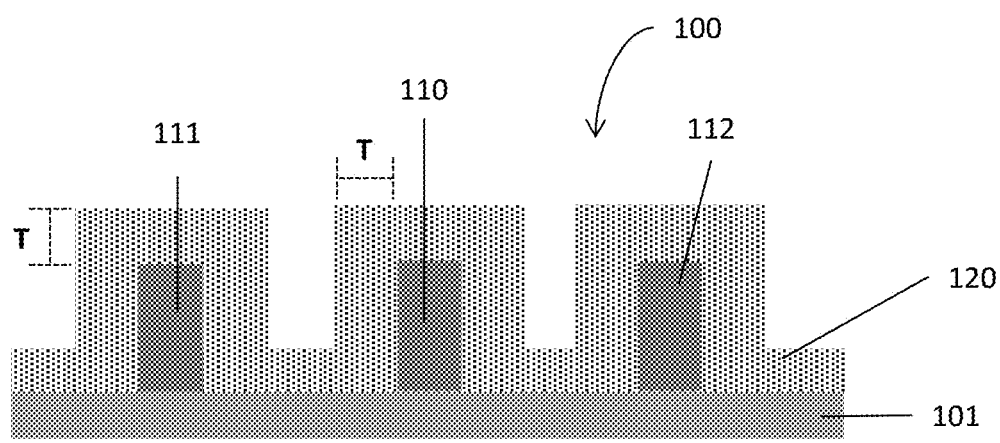

With reference to FIG. 2 in which like reference numerals refer to like features in FIGS. 1 and 1A and at a subsequent fabrication stage of the processing method, a spacer material layer 120 is deposited over structure 100. Spacer material layer 120 may be a conformal layer having an as-deposited thickness, T, covering mandrel lines 110, 111, 112 and exposed portions of patternable layer 101, and may be composed of a dielectric material (e.g., silicon dioxide) deposited by a chemical vapor deposition (CVD) process, an atomic layer deposition (ALD) process, or other suitable deposition process.

Figure 3:
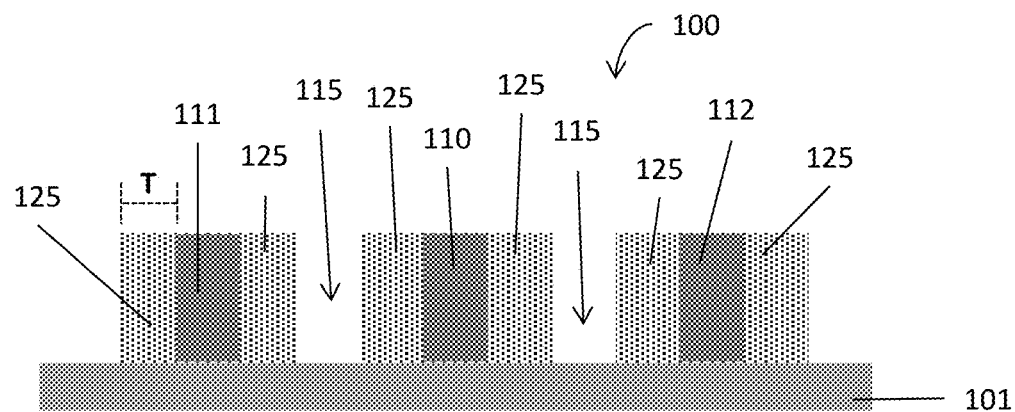

With reference to FIG. 3 in which like reference numerals refer to like features in FIG. 2 and at a subsequent fabrication stage of the processing method, the spacer material layer 120 is etched to form sidewall spacers 125 adjacent mandrel lines 110, 111, 112. Spacer material layer 120 may be etched, for example, by an anisotropic etch process such as a reactive ion etch (RIE) process. The sidewall spacers 125 have the same thickness, T, as the as-deposited spacer material layer 120. Non-mandrel lines 115 are portions of patternable layer 101 not covered by either mandrel lines 110, 111, 112 or sidewall spacers 125.

Figure 4:
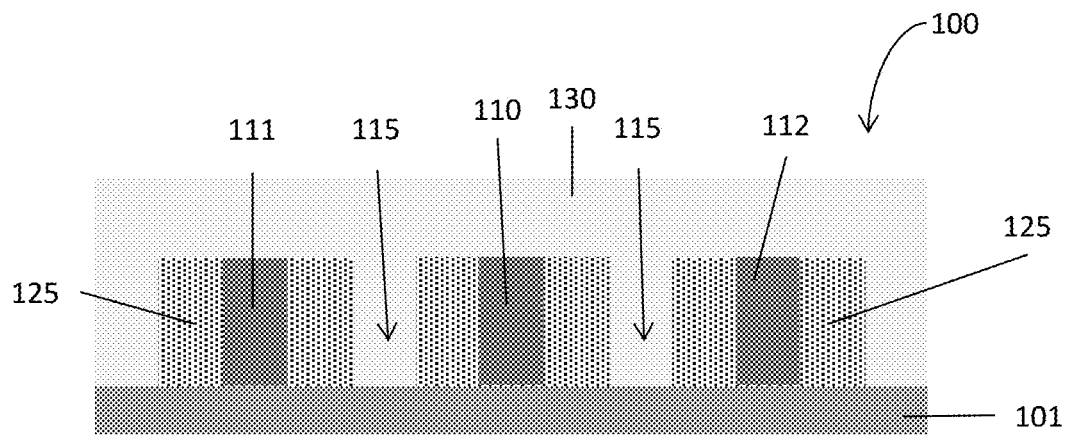

With reference to FIG. 4 in which like reference numerals refer to like features in FIG. 3 and at a subsequent fabrication stage of the processing method, a planarization material layer 130 is deposited over structure 100. Planarization material layer 130 may fill gaps between sidewall spacers 125 to cover non-mandrel lines 115 arranged between the sidewall spacers 125. Planarization material layer 130 may be composed of an organic planarization material, such as a spin-on hardmask (SOH) material. The material composing planarization material layer 130 may be chosen so that planarization material layer 130 etches selective to the material composing mandrel lines 110, 111, 112, the material composing hardmask layer 140 (as described further herein), and the material composing sidewall spacers 125.

Following formation of planarization material layer 130, the planarization material layer 130 may be planarized to be coplanar with mandrel lines 110 and sidewall spacers 125 before provision of a hardmask layer 140, as depicted in FIGS. 5-13A. Alternatively, the hardmask layer 140 may be formed without first planarizing the planarization material layer 130, as depicted in FIGS. 14-21A. Either process may be followed to arrive at the structure depicted in FIGS. 22 and 22A, as described further below.

Figure 5:
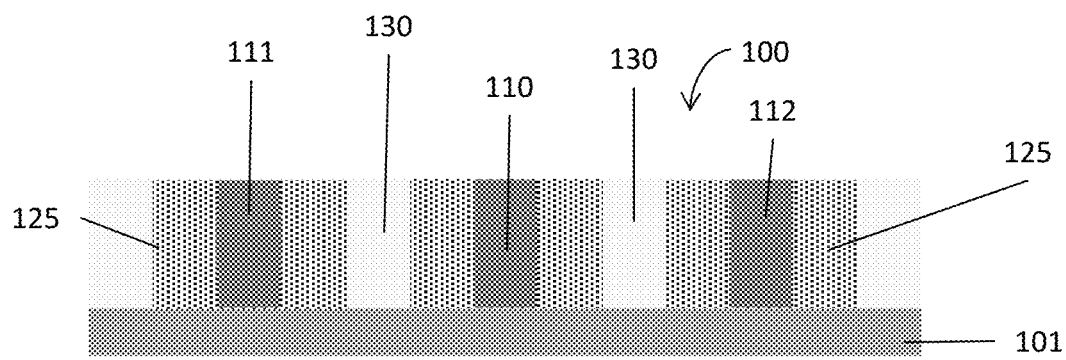
FIGS. 5-13 are cross-sectional views of the structure at successive fabrication stages of a processing method following FIG. 4.

With reference to FIG. 5 in which like reference numerals refer to like features in FIG. 4 and at a subsequent fabrication stage of the processing method, planarization material layer 130 is planarized to remove topography and be coplanar with mandrel lines 110, 111, 112 and sidewall spacers 125.

Figure 6:
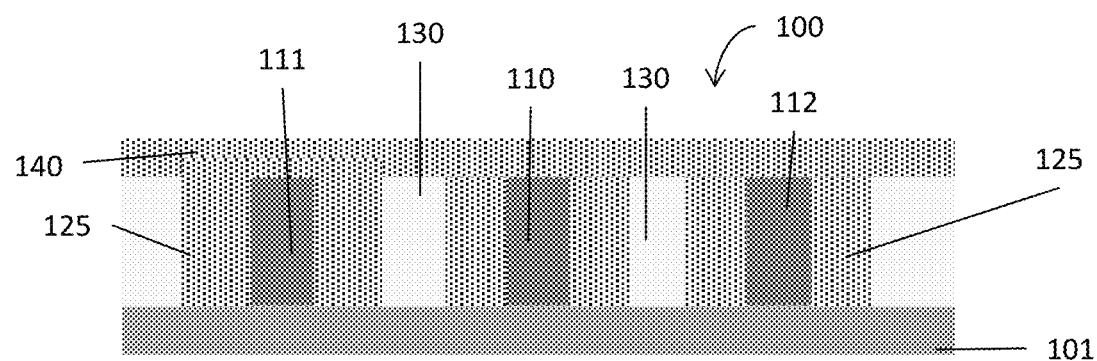

With reference to FIG. 6 in which like reference numerals refer to like features in FIG. 5 and at a subsequent fabrication stage of the processing method, a hardmask layer 140 is formed over structure 100, covering mandrel lines 110, 111, 112, sidewall spacers 125, and planarization material layer 130. The hardmask layer 140 may be, for example, composed of an oxide-based dielectric material (e.g., silicon dioxide). In an embodiment, hardmask layer 140 may be composed of the same material as sidewall spacers 125.

Figure 7:
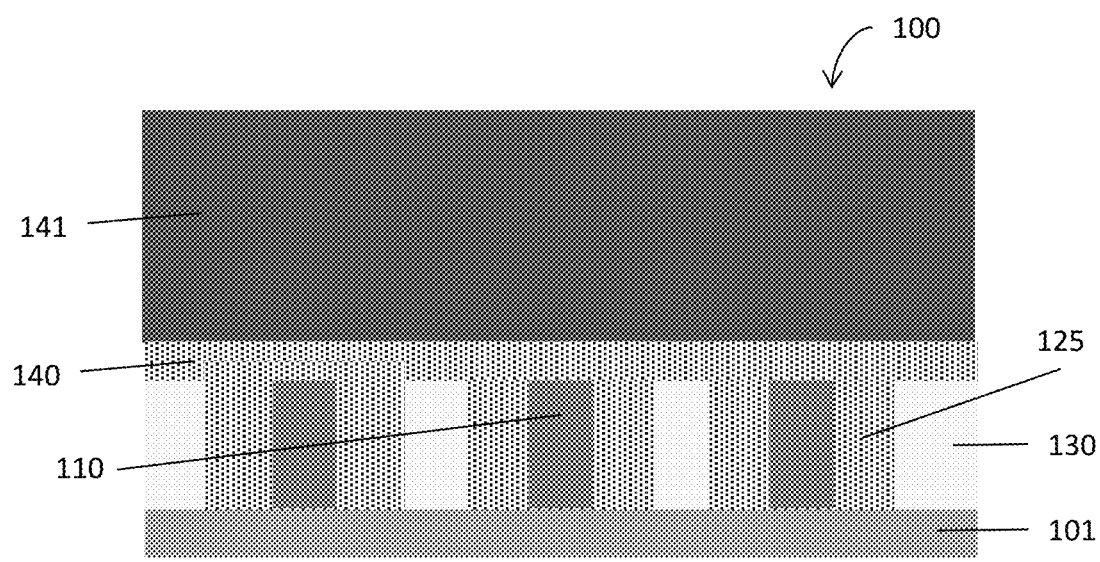

With reference to FIG. 7 in which like reference numerals refer to like features in FIG. 6 and at a subsequent fabrication stage of the processing method, a lithography stack 141 is formed over hardmask layer 140. The lithography stack 141, following patterning as described below, may form a patterned etch mask 142 which may be used to etch portions of hardmask layer 140. The lithography stack 141 may include one or more material layers such as a spin-on hardmask layer, an anti-reflective coating layer, and a photoresist layer, as well as additional layers as needed.

Figure 8:
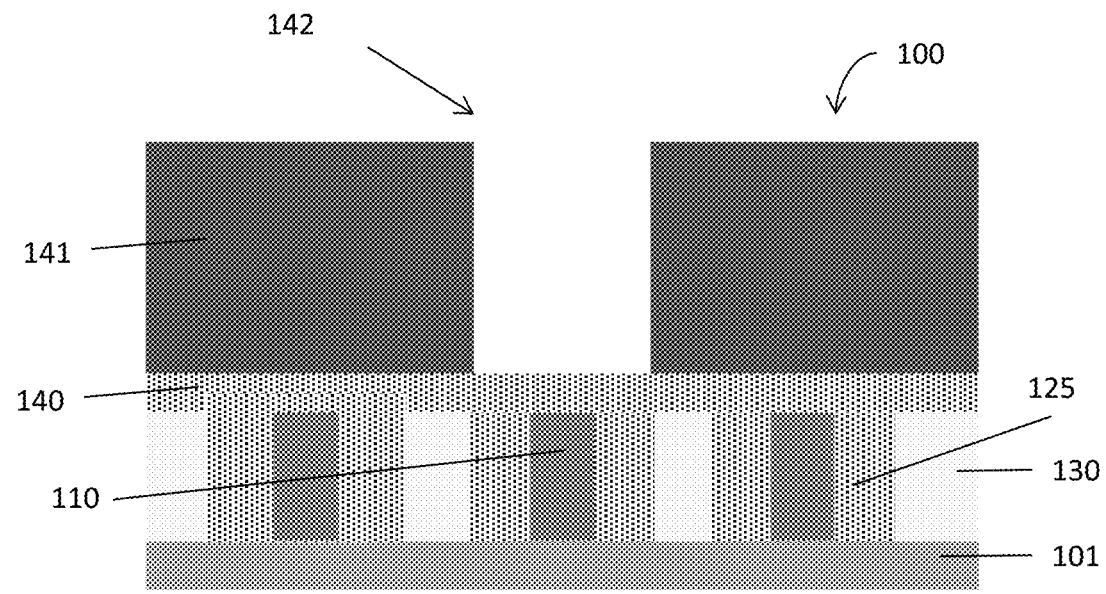
Figure 8A:
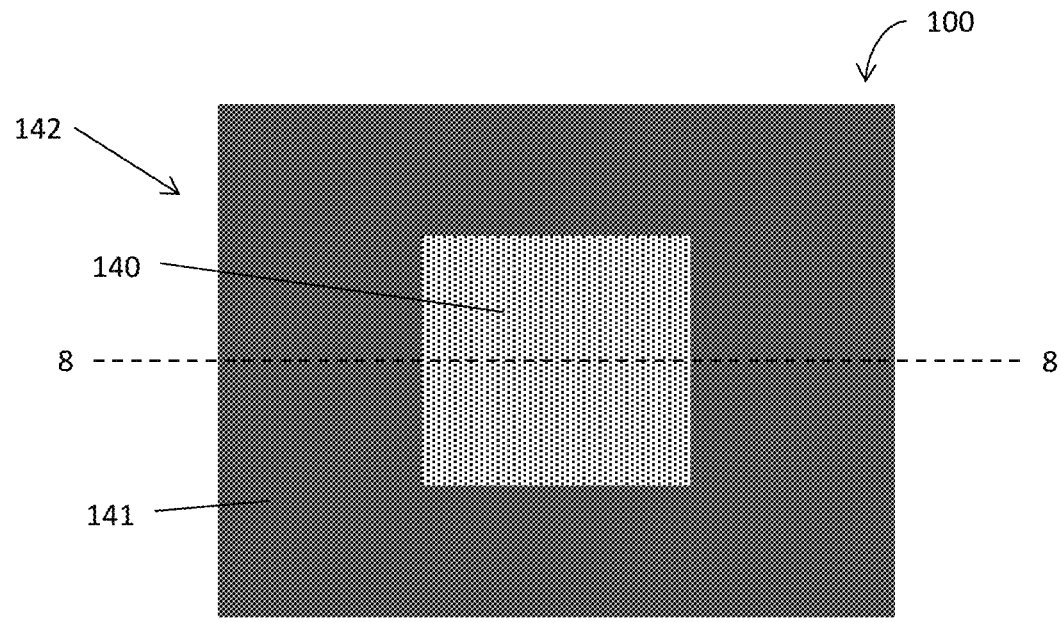
FIGS. 8A, 9A, and 13A are top views of the structure undergoing fabrication respectively depicted in FIGS. 8, 9, and 13.

With reference to FIGS. 8 and 8A in which like reference numerals refer to like features in FIG. 7 and at a subsequent fabrication stage of the processing method, lithography stack 141 is etched to form one or more openings, resulting in formation of a patterned etch mask 142 that exposes portions of hardmask layer 140 to be etched, as described further below. Each opening in patterned etch mask 142 may be formed with lateral margins such that, in subsequent fabrication stages, the material of the planarization material layer 130 covering the non-mandrel lines 115 is masked and protected during etching by the patterned etch mask 142. Each opening in patterned etch mask 142 may be formed with a lengthwise margin that, in subsequent fabrication stages, determines a length of a gap to be formed in mandrel line 110, as described below.

Figure 9:
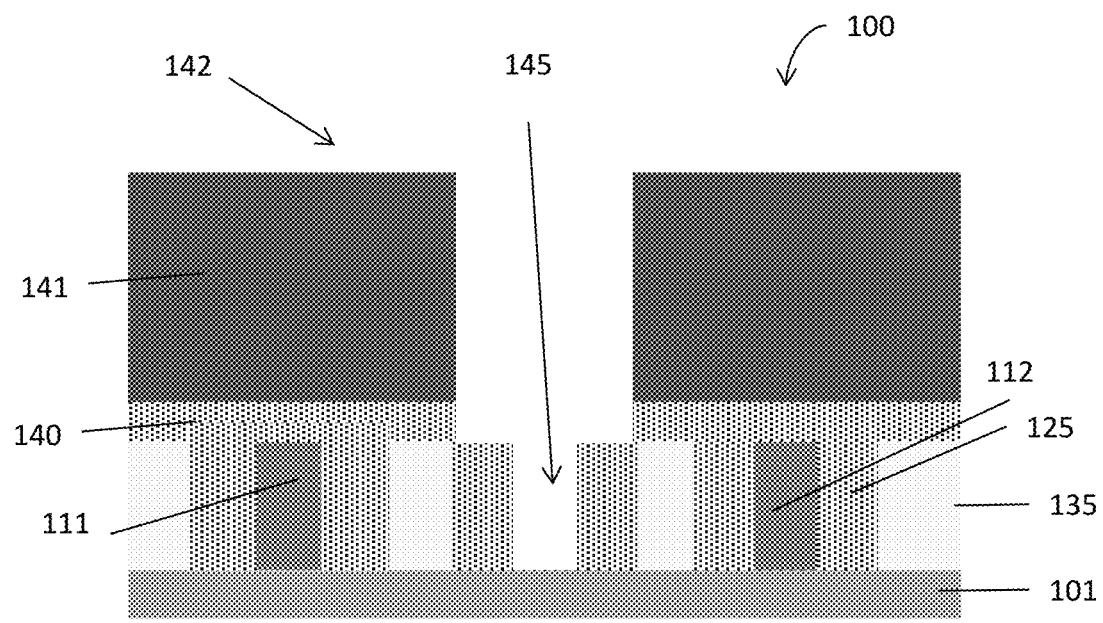
Figure 9A:
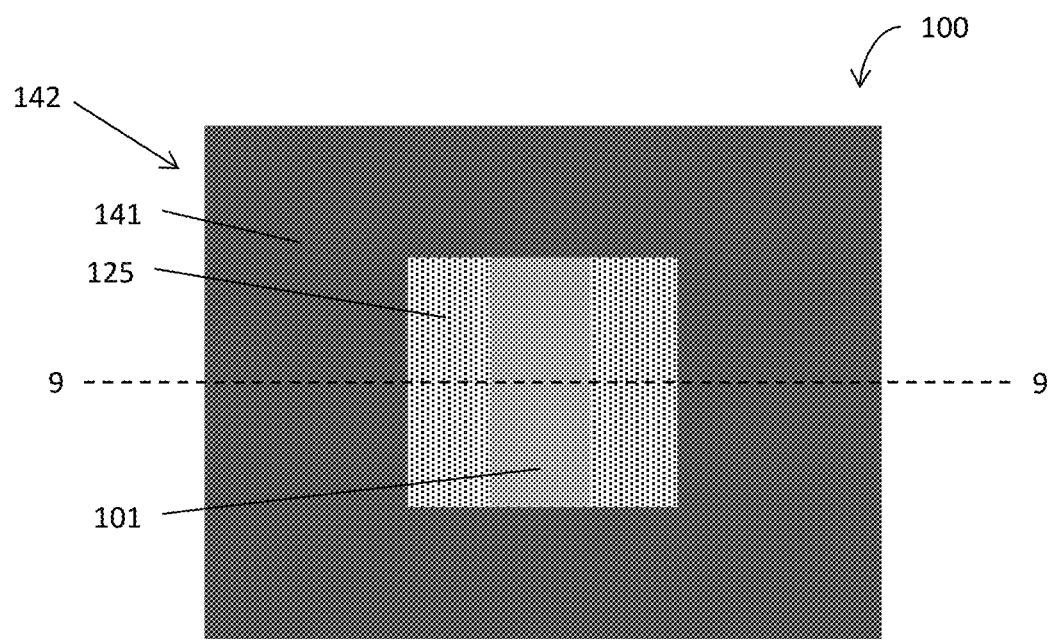

With reference to FIGS. 9 and 9A in which like reference numerals refer to like features in FIGS. 8 and 8A and at a subsequent fabrication stage of the processing method, the portion of hardmask layer 140 exposed by patterned etch mask 142 is etched and removed to expose a portion of mandrel line 110, while leaving mandrel lines 111 and 112 unetched, and the exposed portion of mandrel line 110 is also removed to form a cut or gap 145 in the mandrel line 110. Hardmask layer 140 may be etched and removed, for example, by an anisotropic etch process controlled to terminate when the portion of mandrel line 110 has been exposed to minimize or eliminate damage to sidewall spacers 125 from the etch process. The exposed portions of mandrel line 110 may be selectively etched, for example, by a wet etch process that selectively removes the material (e.g., amorphous silicon) composing mandrel line 110. As described above, each opening in patterned etch mask 142 may have lateral margins that protect the planarization material layer 130 from the etching of both hardmask layer 140 and mandrel line 110.

Figure 10:
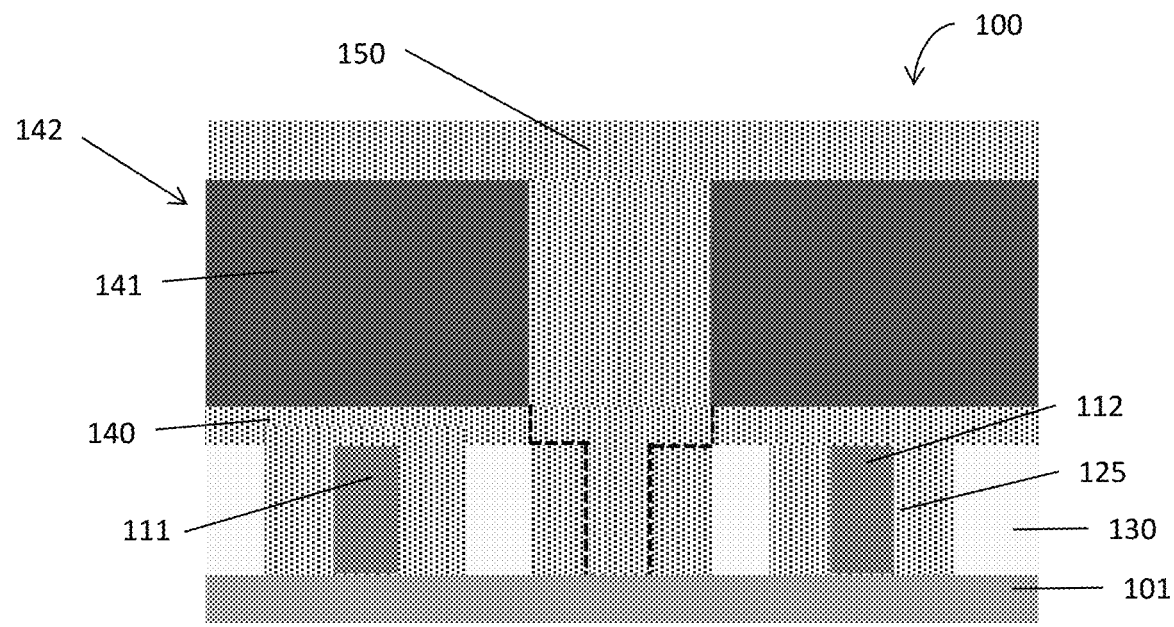

With reference to FIG. 10 in which like reference numerals refer to like features in FIGS. 9 and 9A and at a subsequent fabrication stage of the processing method, a gapfill material 150 is deposited in the gap 145 in mandrel line 110. Gapfill material 150 may also cover patterned etch mask 142. In embodiments the gapfill material 150 may be composed of the same material as sidewall spacers 125, and may be composed of the same material as hardmask layer 140. In an embodiment, the gapfill material 150 may be composed of a spin-on glass or silicon dioxide deposited by ALD.

Figure 11:
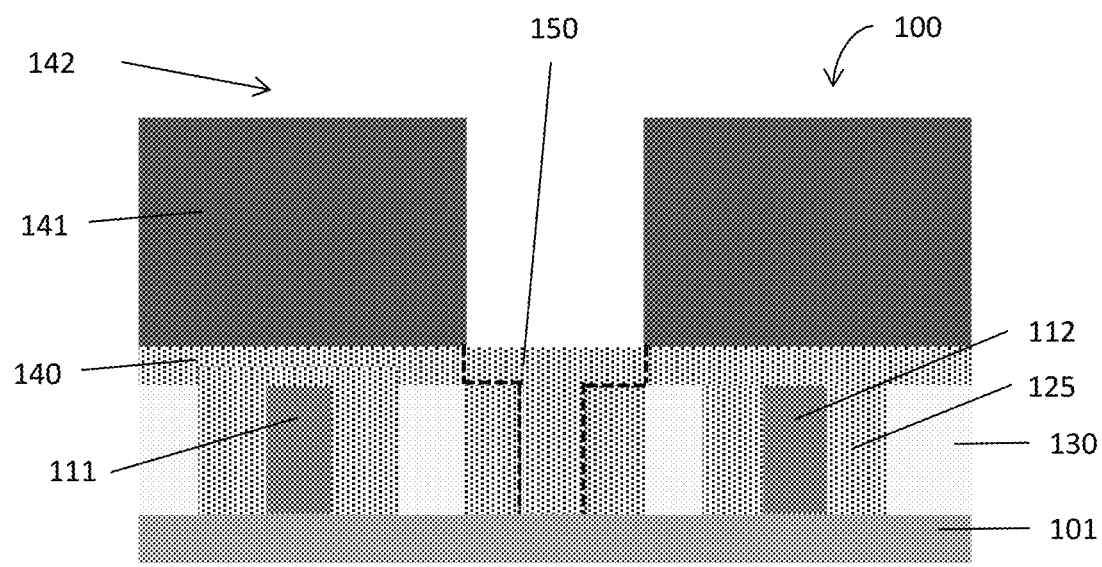

With reference to FIG. 11 in which like reference numerals refer to like features in FIG. 10 and at a subsequent fabrication stage of the processing method, gapfill material 150 is recessed by, for example, an etch-back process. Gapfill material 150 may be recessed to be coplanar with an upper surface of hardmask layer 140 or may be recessed below the upper surface of hardmask layer 140.

Figure 12:
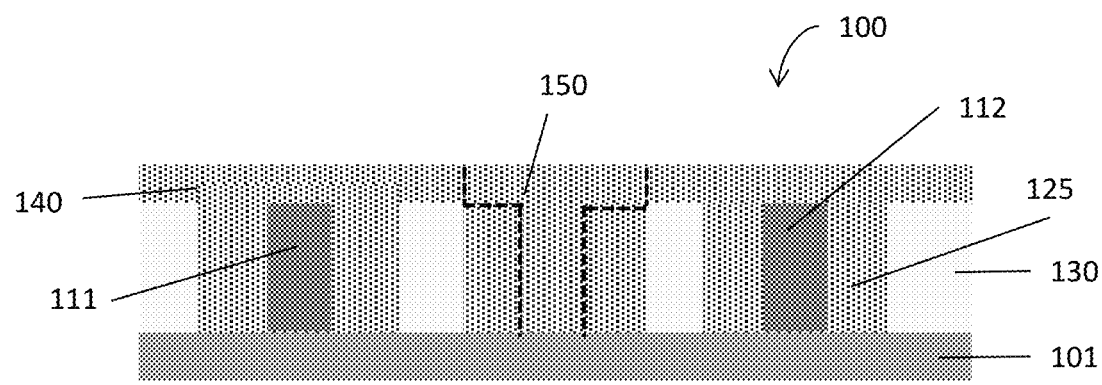

With reference to FIG. 12 in which like reference numerals refer to like features in FIG. 11 and at a subsequent fabrication stage of the processing method, patterned etch mask 142 is removed, leaving hardmask layer 140 and remaining gapfill material 150 exposed.

Figure 13:
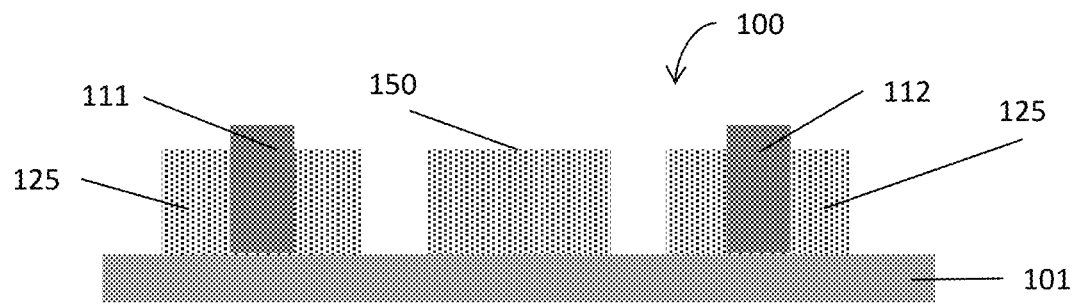
Figure 13A:
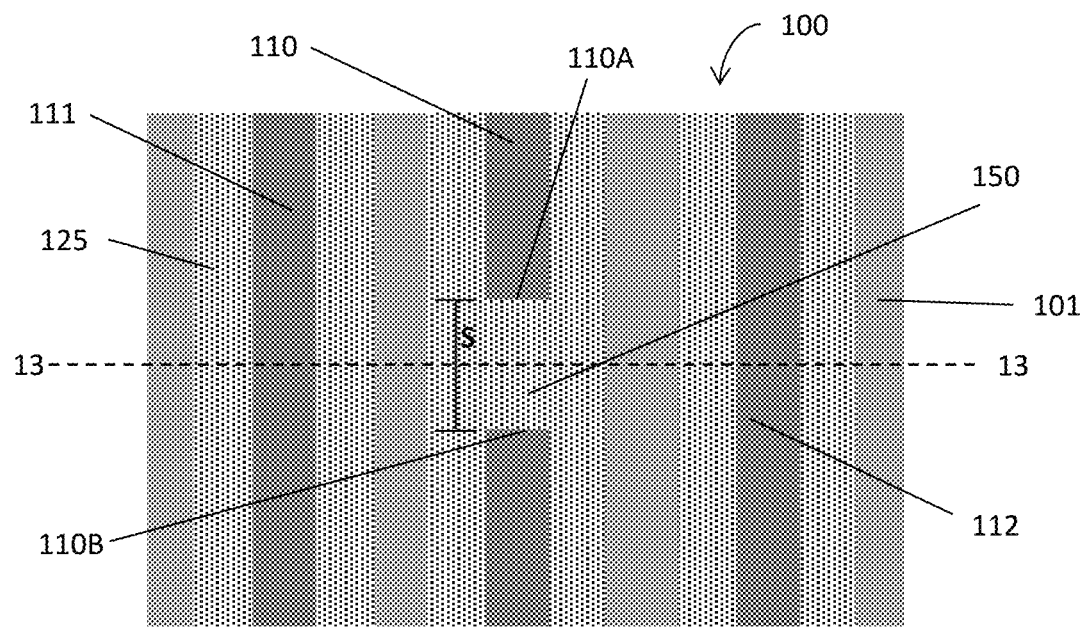

With reference to FIGS. 13 and 13A in which like reference numerals refer to like features in FIG. 12 and at a subsequent fabrication stage of the processing method, hardmask layer 140 is removed along with the exposed remaining portion of gapfill material 150, and non-mandrel lines 115 are exposed by removal of the remaining planarization material layer 130. Hardmask layer 140 and the exposed remaining portion of gapfill material 150 may be removed, for example, by a selective etch process, and may be removed in a single etch step when hardmask layer 140 and gapfill material 150 are composed of the same material, such as an oxide-based dielectric (e.g., silicon dioxide). Planarization material layer 130 may be removed by an additional selective etch process that selectively removes the material composing planarization material layer 130.

As illustrated by FIG. 13A, gapfill material 150 fills the gap(s) in mandrel line 110, and may adjoin sidewall spacers 125. In embodiments where sidewall spacers 125 and gapfill material 150 are composed of the same material, such as silicon dioxide, after patternable layer 101 has been etched according to the pattern formed by the gapfill material 150 and sidewall spacers 125, both sidewall spacers and gapfill material 150 may be removed in a single step. Regarding the cut mandrel line 110, the gap or cut in mandrel line 110 may span a length S between one tip 110A and another tip 110B of the cut mandrel line 110, and the gapfill material 150 may entirely fill the length S between tips 110A and 110B. The length S may be determined by a dimension of an opening in patterned etch mask 142, as described above. The length S may be variable according to the dimensions of the opening in patterned etch mask 142, so that multiple mandrel lines over patternable layer 101 may be etched or cut with variable gap sizes, according to the process described above. Advantageously, the length S is not restricted by dimensions of, for example, sidewall spacers 125 or mandrel lines 110, as the gapfill material 150 will entirely fill the gap or cut in mandrel line 110 regardless of other features on patternable layer 101. In embodiments, the length S may be greater than the thickness T of sidewall spacers 125. In embodiments, the length S may be equal to or greater than twice the thickness T of sidewall spacers 125.

Figure 14:
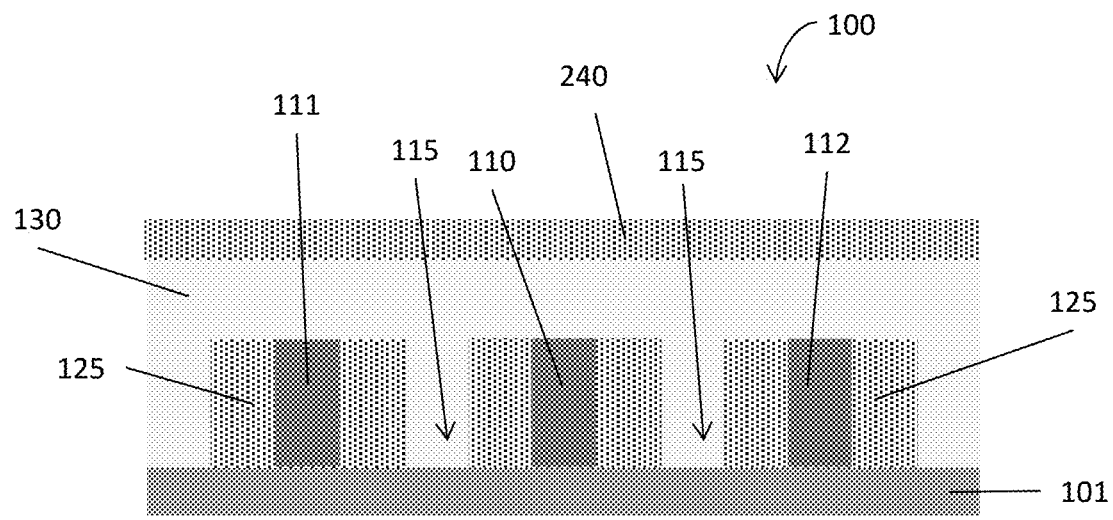
FIGS. 14-21 are cross-sectional views of a structure at successive fabrication stages of another processing method following FIG. 4, in accordance with embodiments of the invention.

With reference to FIG. 14 in which like reference numerals refer to like features in FIG. 4 and at a subsequent fabrication stage of a processing method in accordance with embodiments of the invention, a hardmask layer 240 is formed over planarization material layer 130. In embodiments of the process illustrated by FIGS. 14-21A, planarization material layer 130 is not recessed prior to forming hardmask layer 240.

Figure 15:
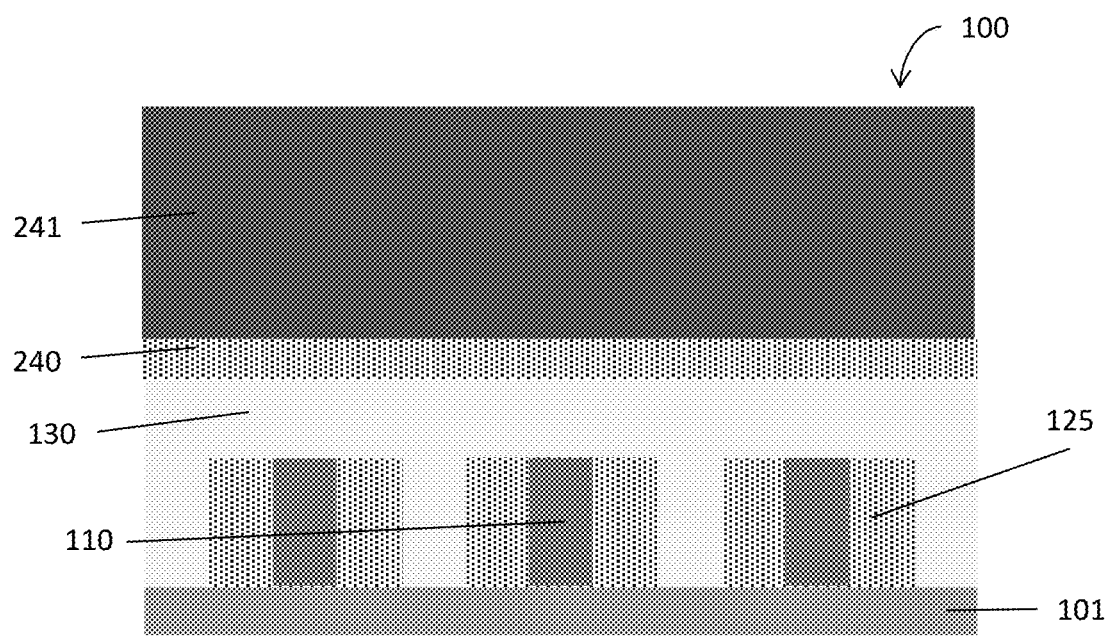

With reference to FIG. 15 in which like reference numerals refer to like features in FIG. 14 and at a subsequent fabrication stage of the processing method, a lithography stack 241 is formed over hardmask layer 240. The lithography stack 241, following patterning as described below, may form a patterned etch mask 142 which may be used to etch portions of hardmask layer 240. The lithography stack 241 may include one or more material layers such as a spin-on hardmask layer, an anti-reflective coating layer, and a photo-resist layer, as well as additional layers as needed.

Figure 16:
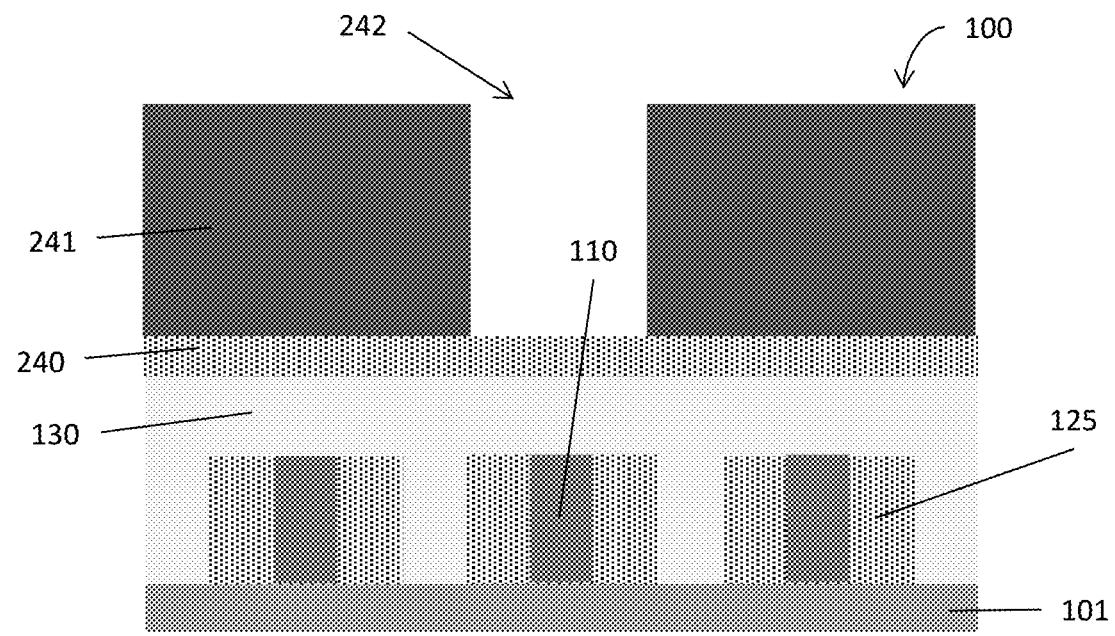
Figure 16A:
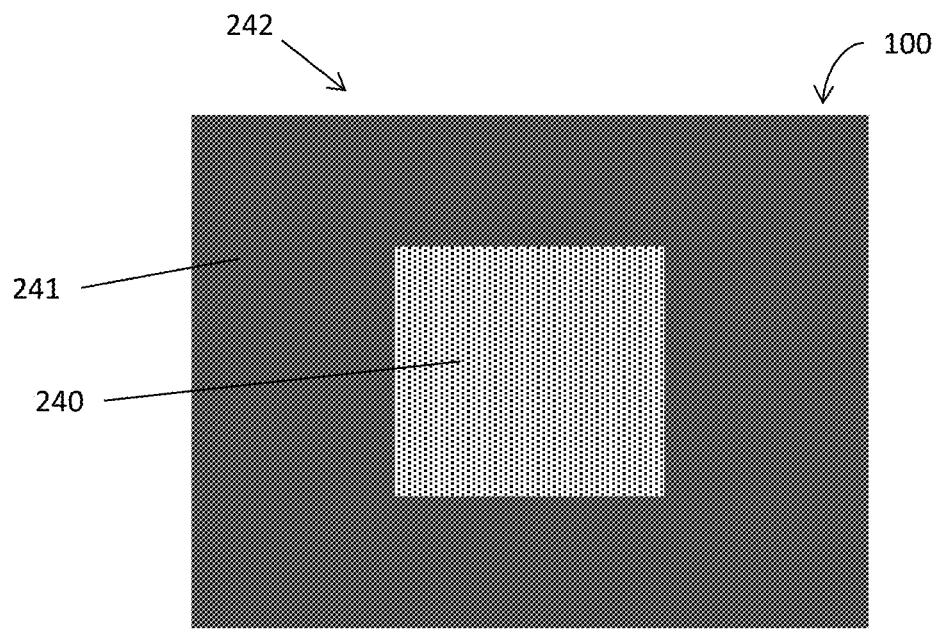
FIGS. 16A, 17A, and 21A are top views of the structure undergoing fabrication respectively depicted in FIGS. 16, 17, and 21.

With reference to FIGS. 16 and 16A in which like reference numerals refer to like features in FIG. 15 and at a subsequent fabrication stage of the processing method, lithography stack 241 is etched to form one or more openings, resulting in a patterned etch mask 242 that exposes portions of hardmask layer 240 to be etched, as described further below. Each opening in patterned etch mask 242 may be formed with lateral margins such that, in subsequent fabrication stages, the material of the planarization material layer 130 is masked and protected during etching by the patterned etch mask 242. Each opening in patterned etch mask 142 may be formed with a lengthwise margin that, in subsequent fabrication stages, determines a length of a gap to be formed in mandrel line 110, as described below.

Figure 17:
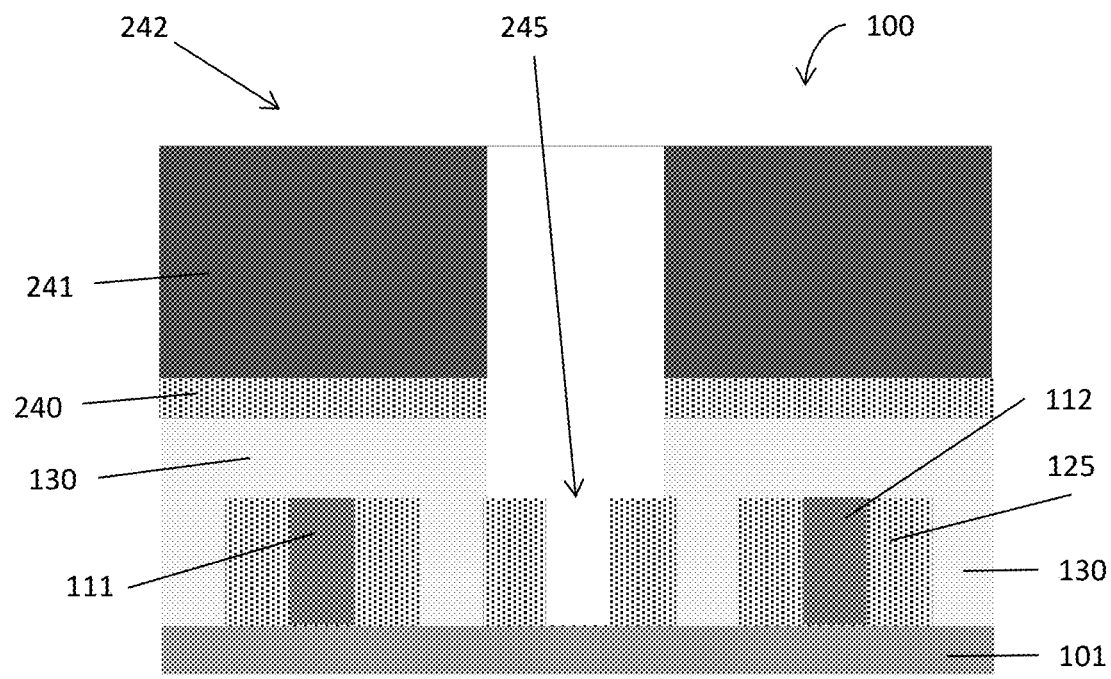
Figure 17A:
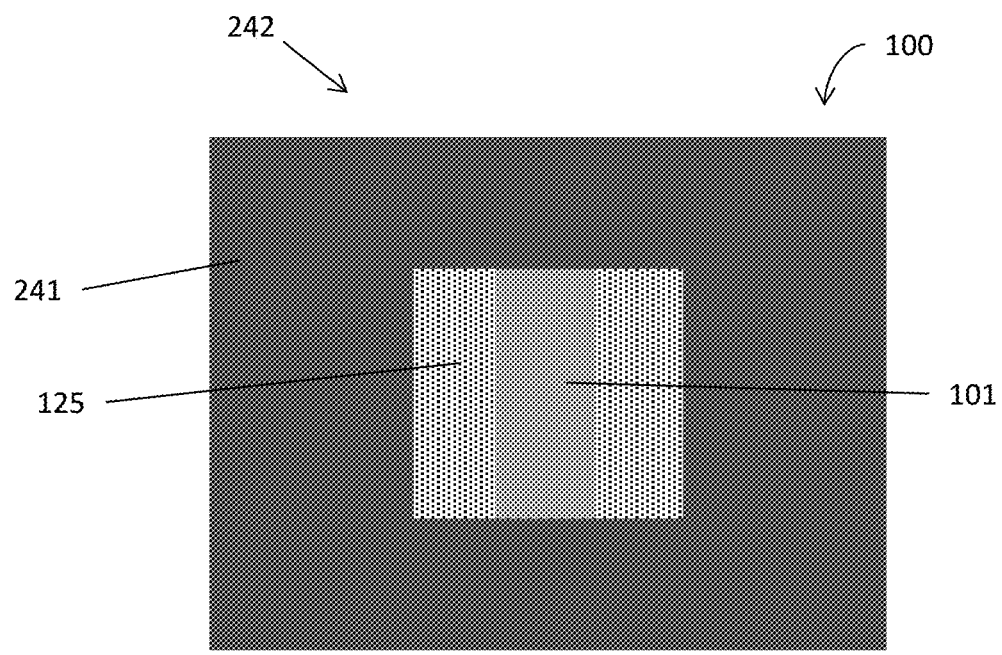

With reference to FIGS. 17 and 17A in which like reference numerals refer to like features in FIGS. 16 and 16A and at a subsequent fabrication stage of the processing method, the portion of hardmask layer 240 exposed by patterned etch mask 242 is etched and removed, a portion of planarization material layer 130 is removed to expose a portion of mandrel line 110, and the exposed portion of mandrel line 110 is also removed to form a gap or cut 245 in the mandrel line 110. Hardmask layer 240 may be etched and removed, for example, by any etch process controlled to terminate when planarization material layer 130 is exposed by the etch process. The portion of planarization material layer 130 exposed by etching of hardmask layer 240 may be etched by any selective etch process that selectively removes the material composing planarization material layer 130. The exposed portions of mandrel line 110 may be selectively etched, for example, by a wet etch process that selectively removes the material (e.g., amorphous silicon) of mandrel lines 110.

Figure 18:
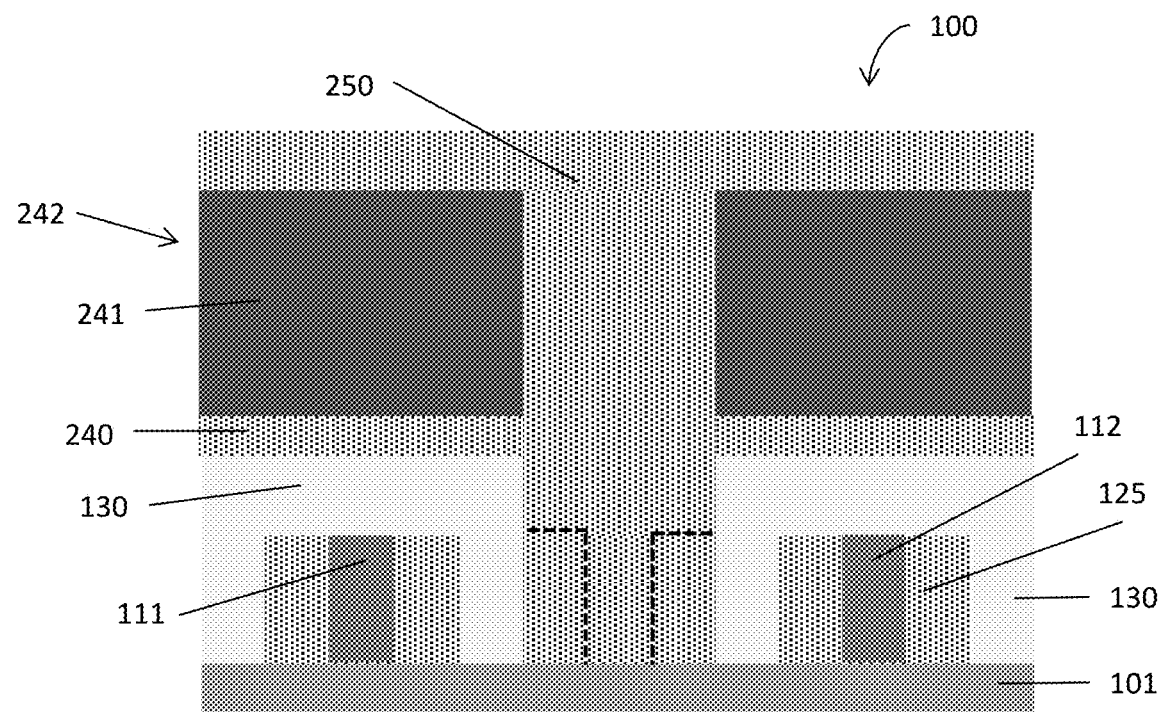

With reference to FIG. 18 in which like reference numerals refer to like features in FIGS. 17 and 17A and at a subsequent fabrication stage of the processing method, a gapfill material 250 is deposited in the gap or cut 245 in mandrel line 110. Gapfill material 250 may also cover patterned etch mask 242. In embodiments the gapfill material 250 may be composed of the same material as sidewall spacers 125, and may be composed of the same material as hardmask layer 240. In an embodiment, the gapfill material 150 may be composed of a spin-on glass or silicon dioxide deposited by ALD.

Figure 19:
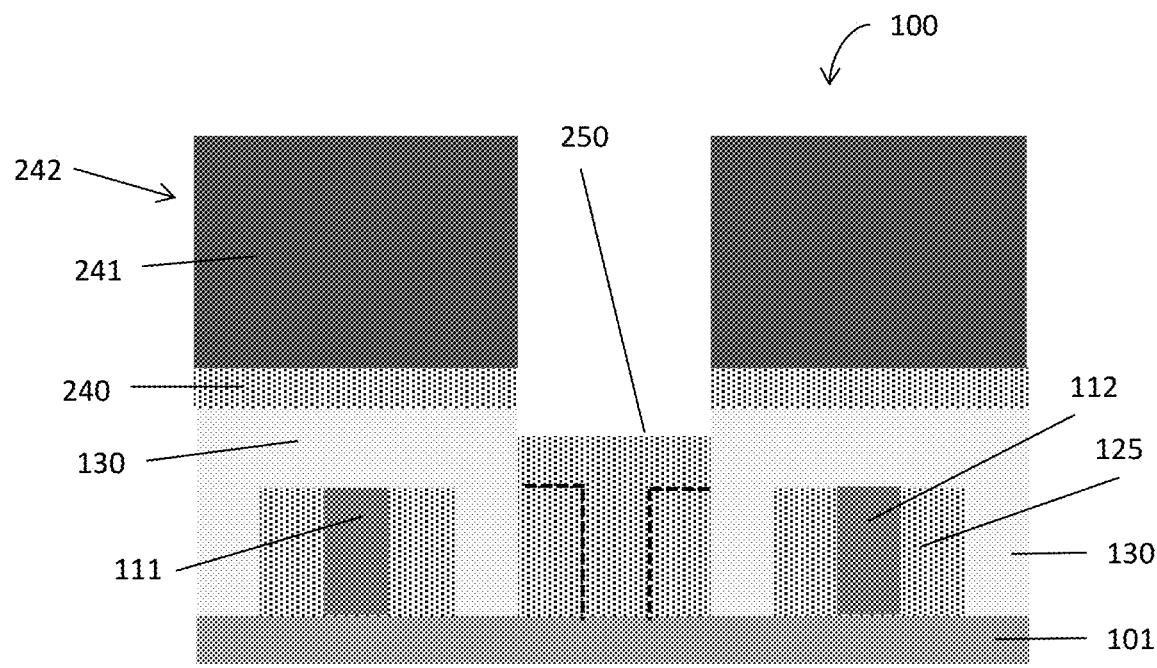

With reference to FIG. 19 in which like reference numerals refer to like features in FIG. 18 and at a subsequent fabrication stage of the processing method, gapfill material 250 is recessed. Gapfill material 250 may be recessed to be coplanar with an upper surface of hardmask layer 240 or may be recessed below the upper surface of hardmask layer 240.

Figure 20:
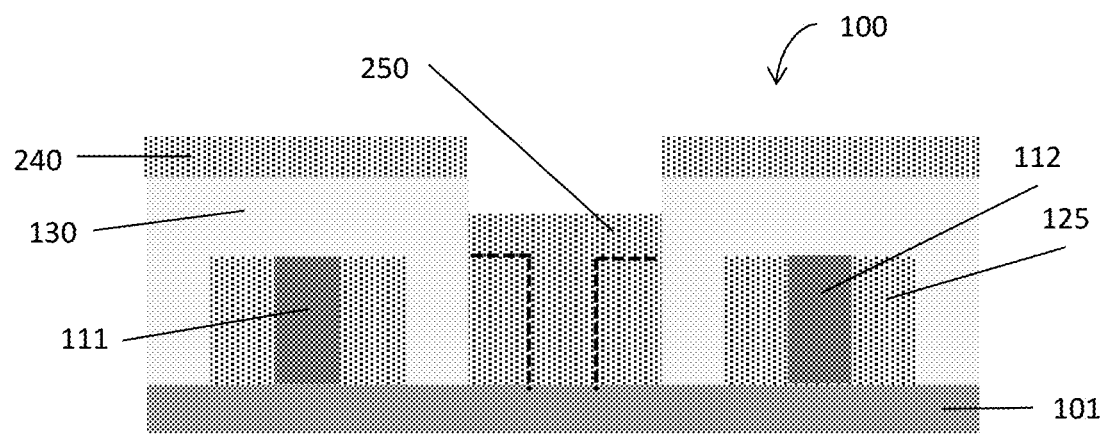

With reference to FIG. 20 in which like reference numerals refer to like features in FIG. 19 and at a subsequent fabrication stage of the processing method, patterned etch mask 242 is removed, leaving hardmask layer 240 and remaining gapfill material 250 exposed.

Figure 21:
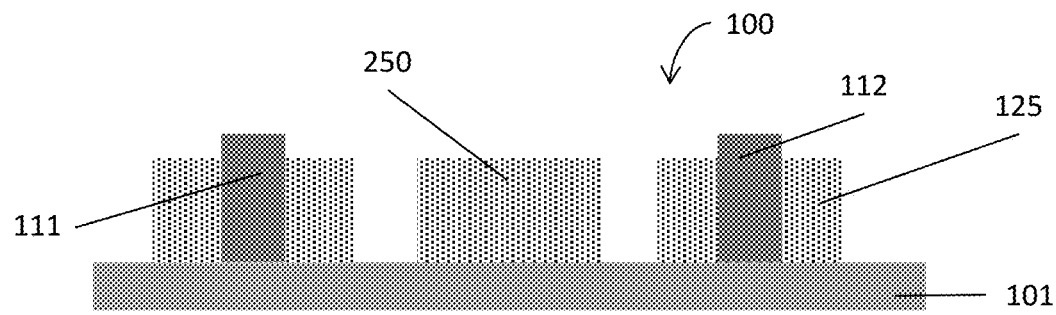
Figure 21A:
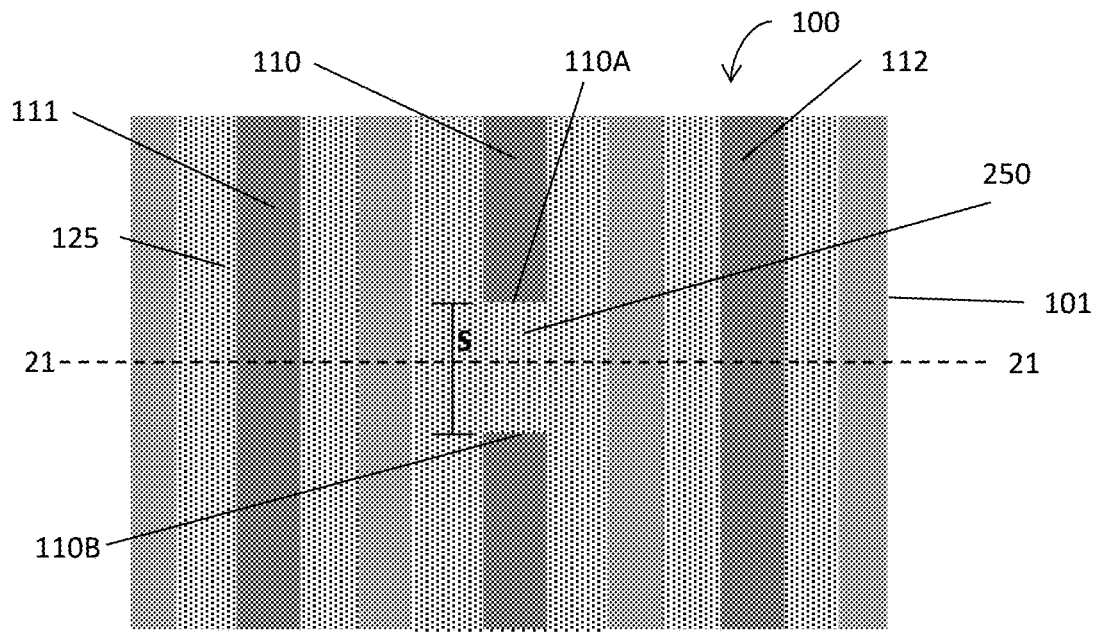

With reference to FIGS. 21 and 21A in which like reference numerals refer to like features in FIG. 20 and at a subsequent fabrication stage of the processing method, hardmask layer 240 is removed along with the exposed remaining portion of gapfill material 250, and the remaining portion of planarization material layer 130 is removed, exposing non-mandrel lines 115. Hardmask layer 240 and the exposed remaining portion of gapfill material 250 may be removed, for example, by a selective etch process, and may be removed in a single etch step when hardmask layer 240 and gapfill material 250 are composed of the same material, such as an oxide-based dielectric (e.g., silicon dioxide). Planarization material layer 230 may be removed by an additional selective etch process that selectively removes the material composing planarization material layer 130.

As illustrated by FIG. 21A, gapfill material 250 fills the gap(s) in mandrel line 110, and may adjoin sidewall spacers 125. In embodiments where sidewall spacers 125 and gapfill material 250 are composed of the same material, such as silicon dioxide, after patternable layer 101 has been etched according to the pattern formed by the gapfill material 250 and sidewall spacers 125, both sidewall spacers and gapfill material 250 may be removed in a single step. Regarding the cut mandrel line 110, the gap or cut in mandrel line 110 may span a length S between one tip 110A and another tip 110B of the cut mandrel line 110, and the gapfill material 250 may entirely fill the length S between tips 110A and 110B. The length S may be determined by a dimension of an opening in patterned etch mask 242, as described above. The length S may be variable according to the dimensions of the opening in patterned etch mask 242, so that multiple mandrel lines over patternable layer 101 may be etched or cut with variable gap sizes, according to the process described above. Advantageously, the length S is not restricted by dimensions of, for example, sidewall spacers 125 or mandrel lines 110, as the gapfill material 250 will entirely fill the gap or cut in mandrel line 110 regardless of other features on patternable layer 101. In embodiments, the length S may be greater than the thickness T of sidewall spacers 125. In embodiments, the length S may be equal to or greater than twice the thickness T of sidewall spacers 125.

Figure 22:
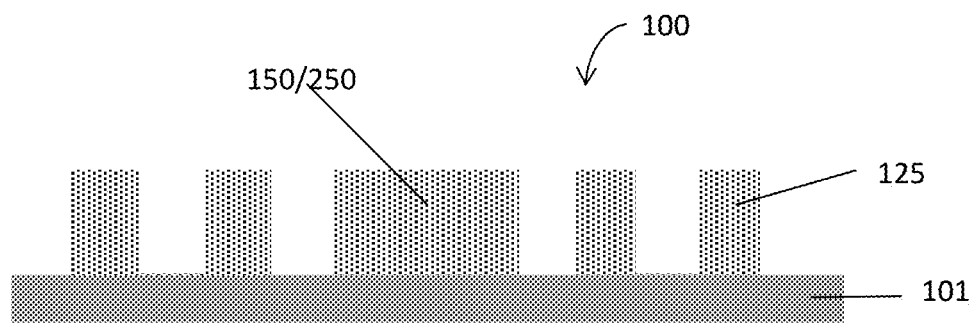
FIG. 22 is a cross-sectional view of the structures of FIG. 13 and FIG. 21 at a successive fabrication stage, in accordance with embodiments of the invention.
Figure 22A:
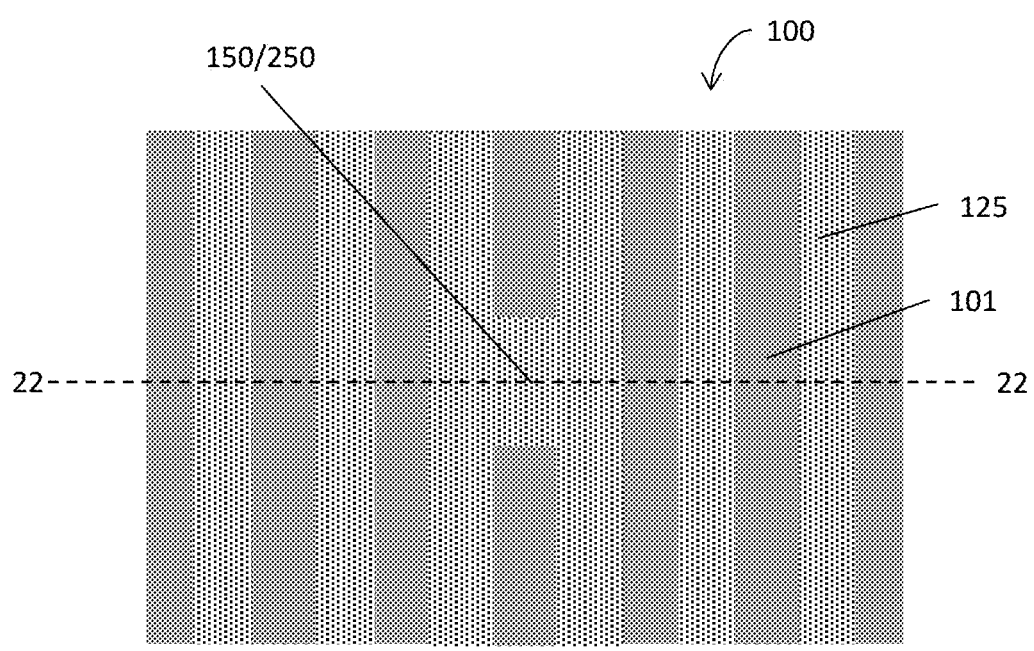
FIG. 22A is a top view of the structure depicted in FIG. 22.

With reference to FIGS. 22 and 22A in which like reference numerals refer to like features in FIGS. 12 and 20 and at a subsequent fabrication stage of the processing methods described above, the remaining mandrel lines 110, 111, 112 are removed by a selective etch process, leaving only sidewall spacers 125 and gapfill material 150/250 over patternable layer 101. Following removal of mandrel lines 110, 111, 112, a complete pattern composed of sidewall spacers 125 and gapfill material 150/250 may remain over patternable layer.

Figure 23:
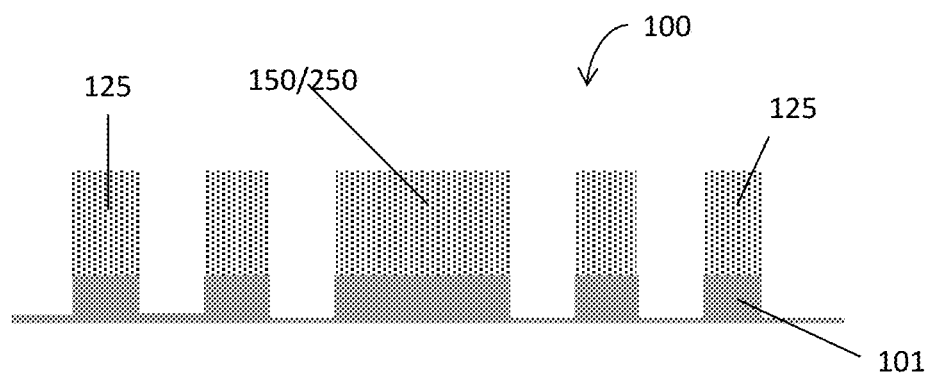
FIG. 23 is a cross-sectional view of the structure of FIG. 22 at a successive fabrication stage, in accordance with embodiments of the invention.

With reference to FIG. 23 in which like reference numerals refer to like features in FIGS. 22 and 22A and at a subsequent fabrication stage of the processing methods described above, portions of patternable layer 101 are etched via an etch process selective to the material composing patternable layer 101, while sidewall spacers 125 and gapfill material 150/250 protect other underlying portions of patternable layer 101. Etched portions of the patternable layer 101 may subsequently be filled with, for example, a conductive material (e.g., copper) to form conductive lines. The etched portions correspond to mandrel lines 110, 111, 112 and non-mandrel lines 115.

By way of summary, the fabrication processes described herein allow for cutting a portion or portions of mandrel lines in multiple-patterning processes. A mandrel line may be cut after it is formed to form a gap in the mandrel line that is subsequently filled with a gapfill material. The gapfill material may advantageously be the same material as sidewall spacers formed adjacent the mandrel lines. The gapfill material fills the entire gap in the cut mandrel line. The span of the gap between ends of the cut mandrel line is determined by the size of an opening formed in a patterned etch layer and hardmask layer used to cut the mandrel line, and thus is not dependent on dimensions of either the mandrel lines or sidewall spacers. The span may be greater than a thickness of the sidewall spacers, and may be equal to or greater than twice the thickness of the sidewall spacers. In embodiments in which multiple mandrel lines are cut, the size of the cuts or gaps may be varied according to the sizes of openings in the patterned etch layer and hardmask layer, as described herein. The hardmask layer may be composed of the same material as the sidewall spacers and the gapfill material.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a first mandrel line and a second mandrel line on a patternable layer;
    forming sidewall spacers on the patternable layer adjacent the first mandrel line and the second mandrel line;
    removing a portion of the first mandrel line to form a gap in the first mandrel line; and
    depositing a gapfill material in the gap in the first mandrel line;
    after depositing the gapfill material in the gap in the first mandrel line, removing the first mandrel line and the second mandrel line selective to the gapfill material to expose portions of the patternable layer; and
    etching the exposed portions of the patternable layer with an etching process,
    wherein the gapfill material and the sidewall spacers are composed of the same material, and the sidewall spacers and the gapfill material mask other portions of the patternable layer from the etching process.

2. The method of claim 1 wherein the gapfill material and the sidewall spacers are composed of an oxide-based dielectric material.

3. The method of claim 1 wherein the gap in the first mandrel line spans a length greater than a thickness of the sidewall spacers.

4. The method of claim 1 wherein the gap in the first mandrel line spans a length greater than twice a thickness of the sidewall spacers.

5. The method of claim 1 wherein the portion of the first mandrel line is removed to form the gap in the first mandrel line after forming the sidewall spacers.

6. A method comprising:
    forming a first mandrel line and a second mandrel line on a patternable layer;
    forming sidewall spacers on the patternable layer adjacent the first mandrel line and the second mandrel line;
    forming a planarization material layer disposed between the sidewall spacers and disposed over the first mandrel line and the second mandrel line;
    removing a portion of the first mandrel line to form a gap in the first mandrel line; and
    depositing a gapfill material in the gap in the first mandrel line,
    wherein the gapfill material and the sidewall spacers are composed of the same material.

7. The method of claim 6 wherein the planarization material layer is composed of a material chosen to etch selective to the sidewall spacers, the first mandrel line, and the second mandrel line.

8. The method of claim 6 wherein the planarization material layer is a spin-on hardmask.

9. The method of claim 6 further comprising:
    before removing the portion of the first mandrel line, planarizing the planarization material layer to be coplanar with the first mandrel line, the second mandrel line, and the sidewall spacers.

10. The method of claim 9 further comprising:
    forming a hardmask layer over the first mandrel line, the second mandrel line, the sidewall spacers, and the planarization material layer; and
    etching a portion of the hardmask layer to expose the portion of the first mandrel line to be removed, wherein a remaining portion of the hardmask layer protects other portions of the first mandrel line and the second mandrel line from being removed.

11. The method of claim 10 wherein etching the portion of the hardmask layer further comprises:
forming a patterned etch mask over the hardmask layer,
wherein the patterned etch mask has an opening exposing the portion of the hardmask layer to be etched, and the opening corresponds to the gap to be formed in the first mandrel line.

12. The method of claim 11 wherein the patterned etch mask comprises a lithography stack, and forming the patterned etch mask over the hardmask layer comprises:
depositing the lithography stack over the hardmask layer, and
etching the lithography stack to form the opening to expose the portion of the hardmask layer to be etched.

13. The method of claim 11 wherein the opening has lateral margins selected to mask the planarization material layer during etching of the hardmask layer and during removing the portion of the first mandrel line.

14. The method of claim 11 further comprising:
recessing the gapfill material to be coplanar with the sidewall spacers;
removing the patterned etch mask and the hardmask layer; and
removing the planarization material layer from the patternable layer.

15. The method of claim 10 wherein the hardmask layer is composed of the same material as the gapfill material.

16. The method of claim 6 further comprising:
before removing the portion of the first mandrel line, forming a hardmask layer over the planarization material layer;
etching a portion of the hardmask layer to expose a portion of the planarization material layer; and
etching the exposed portion of the planarization material layer to expose the portion of the first mandrel line to be removed,
wherein a remaining portion of the hardmask layer protects other portions of the first mandrel line and the second mandrel line from being removed.

17. The method of claim 16 wherein etching the portion of the hardmask layer comprises:
forming a patterned etch mask over the hardmask layer,
wherein the patterned etch mask has an opening exposing the portion of the hardmask layer to be etched, and the opening corresponds to the gap to be formed in the first mandrel line.

18. The method of claim 17 wherein the patterned etch mask comprises a lithography stack, and forming the patterned etch mask over the hardmask layer comprises:
depositing the lithography stack over the hardmask layer, and
etching the lithography stack to form the opening to expose the portion of the hardmask layer to be etched.

19. The method of claim 17 wherein the opening has lateral margins selected to mask the planarization material layer during etching of the hardmask layer and during removing the portion of the first mandrel line.

20. The method of claim 17 further comprising:
recessing the gapfill material to be coplanar with the sidewall spacers;
removing the patterned etch mask and the hardmask layer; and
removing the planarization material layer from over the patternable layer, the first mandrel line, the second mandrel line, and the sidewall spacers.

* * * * *